(12) United States Patent
Ryan

(10) Patent No.: US 8,928,146 B2
(45) Date of Patent: Jan. 6, 2015

(54) BOND PAD CONFIGURATIONS FOR CONTROLLING SEMICONDUCTOR CHIP PACKAGE INTERACTIONS

(71) Applicant: GLOBALFOUNDRIES Inc., Grand Cayman (KY)

(72) Inventor: Vivian W. Ryan, Berne, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/169,606

(22) Filed: Jan. 31, 2014

(65) Prior Publication Data

US 2014/0145330 A1     May 29, 2014

Related U.S. Application Data

(62) Division of application No. 13/218,555, filed on Aug. 26, 2011, now Pat. No. 8,680,681.

(51) Int. Cl.
*H01L 23/52* (2006.01)
*H01L 23/48* (2006.01)
*H01L 23/485* (2006.01)
*H01L 23/00* (2006.01)

(52) U.S. Cl.
CPC ............... *H01L 24/05* (2013.01); *H01L 24/06* (2013.01); *H01L 24/13* (2013.01); *H01L 2224/06177* (2013.01); *H01L 2224/0614* (2013.01); *H01L 24/16* (2013.01); *H01L 24/81* (2013.01); *H01L 2224/0401* (2013.01); *H01L 2224/05552* (2013.01); *H01L 2224/05553* (2013.01); *H01L 2224/05554* (2013.01); *H01L 2224/05555* (2013.01); *H01L 2224/05578* (2013.01); *H01L 2224/06051* (2013.01); *H01L 2224/13111* (2013.01); *H01L 2224/16227* (2013.01); *H01L 2224/81815* (2013.01); *H01L 2924/3511* (2013.01); *H01L 2224/16225* (2013.01)
USPC .................. 257/773; 257/737; 257/E23.02

(58) Field of Classification Search
CPC .......... H01L 24/05; H01L 24/13; H01L 24/08
USPC .................... 257/773, 737, E23.02
See application file for complete search history.

(56) References Cited

U.S. PATENT DOCUMENTS 6,313,541 B1   11/2001  Chan et al.
6,987,323 B2 *  1/2006  Yamane ................ 257/775

* cited by examiner

*Primary Examiner* — Luan C Thai
(74) *Attorney, Agent, or Firm* — Amerson Law Firm, PLLC

(57) ABSTRACT

A semiconductor chip includes at least one integrated circuit device and a bond pad that is electrically connected to the at least one integrated circuit device. The bond pad has an irregular configuration when viewed from above that corresponds to a first area portion that is defined by a first substantially regular geometric shape when viewed from above and a second area portion adjacent to the first area portion. The second area portion is located at a greater distance from a centerline of the semiconductor chip than any part of the first area portion when viewed from above, and two sides of the first area portion are substantially aligned with and substantially flush with two respective sides of the second area portion.

23 Claims, 13 Drawing Sheets

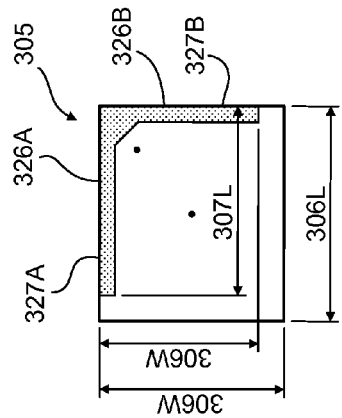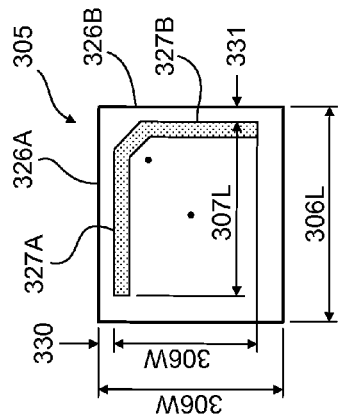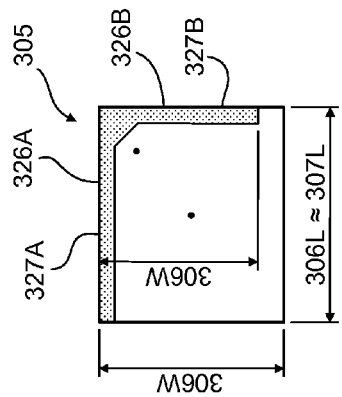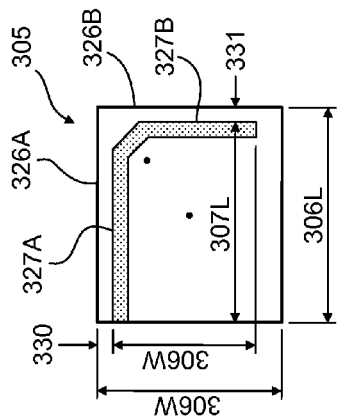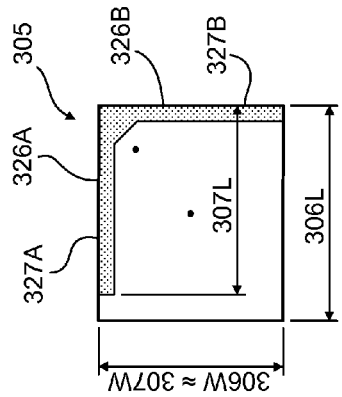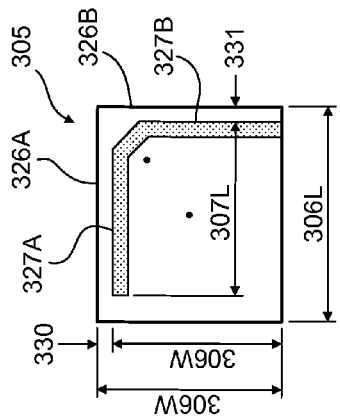
Fig. 3d
Fig. 3e

US 8,928,146 B2

BOND PAD CONFIGURATIONS FOR CONTROLLING SEMICONDUCTOR CHIP PACKAGE INTERACTIONS

CROSS-REFERENCE TO RELATED APPLICATION

This is a divisional of co-pending application Ser. No. 13/218,555, filed Aug. 26, 2011.

BACKGROUND

1. Field of the Disclosure

Generally, the present disclosure relates to sophisticated semiconductor devices, and, more particularly, to bond pad configurations for controlling interactions between semiconductor chips and carrier substrates during the chip/carrier joining process.

2. Description of the Related Art

In the manufacture of modern integrated circuits, it is usually necessary to provide electrical connections between the various semiconductor chips making up a microelectronic device. Depending on the type of chip and the overall device design requirements, these electrical connections may be accomplished in a variety of ways, such as, for example, by wirebonding, tape automated bonding (TAB), flip-chip bonding, and the like. In recent years, the use of flip-chip technology, wherein semiconductor chips are attached to carrier substrates, or to other chips, by means of solder balls formed from so-called solder bumps, has become an important aspect of the semiconductor processing industry. In flip-chip technology, solder balls are formed on a contact layer of at least one of the chips that is to be connected, such as, for example, on a dielectric passivation layer formed above the last metallization layer of a semiconductor chip comprising a plurality of integrated circuits. Similarly, adequately sized and appropriately located bond pads are formed on another chip, such as, for example, a carrier package, each of which corresponds to a respective solder ball formed on the semiconductor chip. The two units, i.e., the semiconductor chip and carrier substrate, are then electrically connected by "flipping" the semiconductor chip and bringing the solder balls into physical contact with the bond pads, and performing a "reflow" process so that each solder ball bonds to a corresponding bond pad. Typically, hundreds of solder bumps may be distributed over the entire chip area, thereby providing, for example, the I/O capability required for modern semiconductor chips that usually include complex circuitry, such as microprocessors, storage circuits, three-dimensional (3D) chips, and the like, and/or a plurality of integrated circuits forming a complete complex circuit system.

In many processing applications, a semiconductor chip is bonded to a carrier substrate during a high temperature so-called Controlled Collapse Chip Connection (C4) solder bump reflow process. Typically, the substrate material is an organic laminate, which has a coefficient of thermal expansion (CTE) that may be on the order of 4-5 times greater than that of the semiconductor chip, which, in many cases, is made up primarily of silicon and silicon-based materials. Accordingly, due to the coefficient of thermal expansion mismatch between the chip and the substrate (i.e., silicon vs. organic laminate), the substrate will grow more than the chip when exposed to the reflow temperature, and as a consequence, stresses will be imposed on the chip/substrate package as the package cools and the solder bumps solidify. FIGS. 1a-1c, which schematically illustrate at least some of the possible effects that may occur on a chip package during this process, will now be described.

FIG. 1a schematically illustrates a chip package 100, which includes a carrier substrate 101 and a semiconductor chip 102. The semiconductor chip 102 typically comprises a plurality of solder bumps 103, which are formed above a metallization system 104 (see FIG. 1c) of the chip 102. During the chip packaging assembly process, the semiconductor chip 102 is inverted, or "flipped," and brought into contact the carrier substrate 101, after which the chip package 100 of FIG. 1a is exposed to a solder bump reflow process 120 at a reflow temperature that exceeds the melting temperature of the solder bump material. Depending on the specific solder alloy used to form the solder bumps 103, the reflow temperature may be upwards of 200-265° C. During the reflow process 120, when the material of the solder bumps 103 is in a liquid phase, both the carrier substrate 101 and the semiconductor chip 102 are able to thermally "grow" in a substantially unrestrained manner, based on the respective coefficient of thermal expansion of each component. As such, both the carrier substrate 101 and the semiconductor chip 102 remain in an essentially flat, non-deformed condition, although each will grow by a different amount due to their different coefficients of thermal expansion.

FIG. 1b, on the other hand, schematically illustrates the chip package 100 during a cool-down phase, when a thermal interaction begins to take place between the carrier substrate 101 and the semiconductor chip 102. As the chip package 100 cools, the solder bumps 103 solidify and mechanically join the package substrate 101 to the semiconductor chip 102. As the chip package 100 continues to cool after solder bump 103 solidification, the CTE mismatch between the materials of the carrier substrate 101 and the semiconductor chip 102 cause the substrate 101 to shrink at a greater rate than the chip 102. Typically, this difference in thermal expansion/contraction is accommodated by a combination of out-of-plane deformation of both the carrier substrate 101 and the semiconductor chip 102, and some amount of shear deformation of the solder bumps 103. Other localized effects may occur in the semiconductor chip 102 in areas immediately surrounding the solder bumps 103, as illustrated in FIG. 1c and described below.

FIG. 1c schematically illustrates an area of the semiconductor chip 102 surrounding an individual solder bump 103A after cool-down of the chip package 100. For simplicity, the semiconductor chip 102 has been inverted compared to the chip packaging configurations illustrated in FIGS. 1a-1b, and the carrier substrate is not shown. Furthermore, only the uppermost metallization layers 104A, 104B and 104C of a metallization system 104 of the semiconductor chip 102 are shown in FIG. 1c, any metallization layers below layer 104C, device layers, or substrate layers of the chip 102 have not been depicted. The semiconductor chip 102 also includes a bond pad 105 formed in the last metallization layer 104A, a passivation layer 106 formed above the last metallization layer 104A, and a solder bump 103A formed above the bond pad 105. Additionally, as shown in FIG. 1c, the bond pad 105 is in contact with a contact structure 107 so as to facilitate the electrical connection of the solder bump 103A and the carrier substrate 101 (not shown in FIG. 1c) to an integrated circuit (not shown) of the semiconductor chip 102 formed in the device level (not shown) below the metallization system 104. For illustrative purposes only, the contact structure 107 may include, for example, a contact via 107B formed in the metallization layer 104B, a conductive line 107C and a contact via 107D in the metallization layer 104C, and the like, whereas other configurations may also be used.

During the cool-down phase, the out-of-plane deformation of the chip package 100 that is caused by the thermal interaction of the semiconductor chip 102 and the carrier substrate 101 will develop as a shear load 103S, a tensile load 103T, and bending moment 103M across the solder bump 103A. However, since the solder material is, in general, very robust, and typically has a strength that exceeds that of the materials that make up the semiconductor chip 102—and in particular, the metallization system 104—relatively little deformation energy will be absorbed by the solder bump 103A. Instead, the majority of the loads 103S, 103T and 103M will be translated through the bond pad 105 and into the metallization layers underlying the solder bump 103A, resulting in highly localized tensile stresses, such as a vertical or uplift tensile stress 104U, and a lateral or stretching tensile stress 104S. If these tensile stresses are high enough, a local delamination of one or more of the uppermost metallization layers may occur below the solder bump 103A. Typically, a metallization layer delamination will manifest as a crack 108, and will normally occur where the uplift tension is highest—i.e., near the edge 105E of the bond pad 105, as shown in FIG. 1c. In many cases, the crack 108 may only occur in a single metallization layer, such as the layer 104B shown in FIG. 1c, whereas in other cases, the crack 108 may propagate deeper into the underlying metallization system 104, from one metallization layer to another.

Delamination failures and cracks, such as the crack 108, that may occur in a metallization layer below a solder bump 103 are sometimes subject to premature failure, as the solder bump 103 may not make a good electrical connection to the contact structures below. However, since the delamination/crack defects described above do not occur until the chip packaging assembly stage of semiconductor chip manufacture, the defects will generally not be detected until a final quality inspection is performed. Typically, after the flip-chip operation is completed, the chip package 100 will be subjected to acoustic testing, such as C-mode acoustic microscopy (CSAM). Cracks 108 that may be present in the metallization system 104 of the semiconductor chip 102 below the solder bumps 103 will have a white appearance during the CSAM inspection process, and are therefore sometimes referred to as "white bumps," "white spots," or "ghost bumps." White bump defects impose a costly downside to the overall chip manufacturing process, as they do not occur, and hence cannot be detected, until a significant material and manufacturing investment in the chip has already occurred.

Moreover, recent changes and advances in the types of materials used in sophisticated semiconductor devices have also had an impact on the frequency in which white bumps occur. For example, for many years, the materials used for forming solder balls used in flip-chip technology included any one of a variety of so-called tin/lead (Sn/Pb) solders. Typically, the alloys that were used for most Sn/Pb solders have a level of ductility that enabled the Sn/Pb solder bumps to deform under the loads induced during the cool-down phase of the solder bump reflow process, thereby absorbing some of the out-of-plane deformation energy discussed above. However, in recent years, industries have generally moved away from the use of Sn/Pb solders in most commercial applications, including semiconductor processing. Accordingly, lead-free soldering materials, such as Sn/Ag (tin-silver), Sn/Cu (tin-copper), Sn/Ag/Cu (tin-silver-copper, or SAC) solders, and the like, have been developed as substitute alloys for forming solder bumps on semiconductor chips. These lead-free substitute soldering materials generally have a higher material strength and lower ductility than most of the commonly-used Sn/Pb solders, and also typically require higher temperatures for reflow. As such, less deformation energy is absorbed by lead-free solder bumps, and a commensurately higher loading is imparted on the metallization system underlying the solder bumps, which subsequently increases the frequency of white bump occurrence.

Additionally, the development and use of dielectric materials having a dielectric constant (or k-value) of approximately 3.0 or lower—which are often referred to as "low-k dielectric materials"—has led to an increased incidence of white bumps. Typically, low-k dielectric materials have lower mechanical strength, mechanical modulus, and adhesion strength than do some of the more commonly used dielectric materials having higher k-values, such as silicon dioxide, silicon nitride, silicon oxynitride, and the like. As metallization systems utilize more metallization layers that are made up of low-k dielectric materials, there is a greater likelihood that the lower strength low-k materials will rupture when exposed to the loads that are imposed on the metallization layers underlying the solder bumps, thus leading to delaminations and cracks—i.e., white bump defects. In particular, cracks tend to occur, or at least initiate, in the low-k metallization layers that are closest to the upper surface of the a semiconductor chip—i.e., closest to the last metallization layer—as the deformation energy is greatest near the upper surface, and lessens in lower metallization levels. Furthermore, it appears that the type of white bump problems described above are even further exacerbated in metallization layers comprised of ultra-low-k (ULK) materials having k-values of approximately 2.7 or lower.

It should be noted that, while FIGS. 1a-1c describe typical white bump problems that may be associated with flip-chip packaging problems, the issues identified above are equally applicable to other chip package configurations, such as 3D-chips and the like. Accordingly, and in view of the foregoing, there is a need to implement new design strategies to address the manufacturing issues associated with white bumps that occur during typical chip packaging operations. The present disclosure relates to process device designs and methods that are directed to avoiding, or at least mitigating, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to sophisticated semiconductor chips that may be less susceptible to the occurrence of white bumps during semiconductor chip packaging operations, such as flip-chip or 3D-chip assembly, and the like. One illustrative semiconductor chip disclosed herein includes at least one integrated circuit device and a bond pad that is electrically connected to the at least one integrated circuit device. Furthermore, the bond pad has an irregular configuration when viewed from above that corresponds to a first area portion that is defined by a first substantially regular geometric shape when viewed from above and a second area portion adjacent to the first area portion. Additionally, the second area portion is located at a greater distance from a centerline of the semiconductor chip than any part of the first area portion when viewed from above, and two sides of the first area portion are substantially aligned with and substantially flush with two respective sides of the second area portion.

Also disclosed herein is an exemplary semiconductor chip that includes at least one integrated circuit device and a bond pad that is electrically connected to the at least one integrated circuit device. The bond pad has a substantially irregularly shaped overall bond pad configuration when viewed from above that includes, among other things, a first bond pad area portion that is defined by a first substantially regular geometric shape when viewed from above and a second bond pad area portion that is defined by at least part of a second substantially regular geometric shape when viewed from above. Furthermore, an upper surface of the second bond pad area portion is substantially coplanar with an upper surface of the first bond pad area portion and two sides of the first bond pad area portion are substantially aligned with and substantially flush with two respective sides of the second bond pad area portion.

In yet another illustrative embodiment of the present disclosure, a semiconductor chip includes a first integrated circuit device, a second integrated circuit device, a first bond pad that is electrically connected to the first integrated circuit device, and a second bond pad that is electrically connected to the second integrated circuit device. The first bond pad has a substantially irregularly shaped overall bond pad configuration when viewed from above that includes, among other things, a first bond pad area portion that is defined by a first substantially regular geometric shape when viewed from above, wherein the first bond pad area portion has a first area centroid that is located at a first distance from a center of the semiconductor chip. The first bond bad further includes a second bond pad area portion that is defined by at least part of a second substantially regular geometric shape when viewed from above, wherein the second bond pad area portion has a second area centroid that is located at a second distance from the center of the semiconductor chip that is greater that the first distance. The second bond pad has a substantially regularly shaped overall bond pad configuration when viewed from above that is defined by a third substantially regular geometric shape that is substantially the same as the first substantially regular geometric shape. Moreover, the third substantially regular geometric shape has a third area centroid that is located a third distance from the center of the semiconductor chip that is less than the first distance.

BRIEF DESCRIPTION OF THE DRAWINGS

The disclosure may be understood by reference to the following description taken in conjunction with the accompanying drawings, in which like reference numerals identify like elements, and in which:

FIGS. 3b-3f schematically illustrate plan and section views of bond pads in accordance with additional illustrative embodiments of the present disclosure.

Figure 1A:
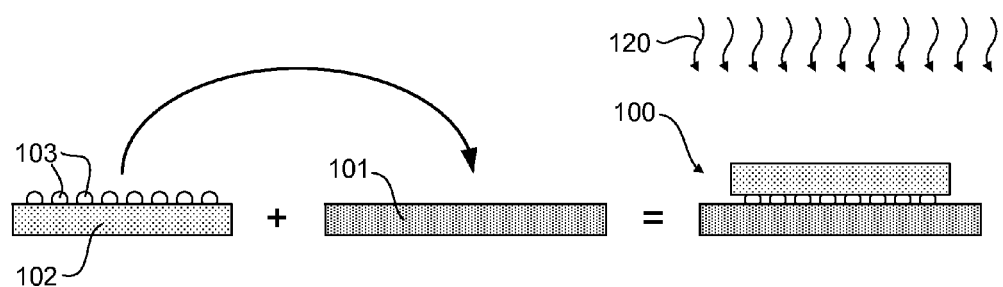
FIGS. 1a-1b schematically illustrate a flip-chip packaging operation of a semiconductor chip and a carrier substrate.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the presently disclosed subject matter is directed to semiconductor chips wherein at least some of the bond pads formed in the upper metallization layer of the chip metallization system have configurations that are adapted to reduce, or at least mitigate, the occurrence of white bumps caused by the differential thermal expansion effects imposed on the metallization layers of the semiconductor chip during chip packaging operations. In particular, bond pads that are located in areas of a semiconductor chip that are typically exposed to the highest out-of-plane loads caused by the CTE (coefficient of thermal expansion) mismatch between the semiconductor chip and the carrier substrate may have irregular or composite configurations that are adapted to reduce the magnitude of the crack-inducing stresses and/or strains induced in the metallization layers underlying a given solder bump and bond pad. For example, since the size of a body—i.e., its length or width—is one factor that may have a significant effect on the total amount of thermal expansion that body undergoes when exposed to an elevated temperature, the points of greatest thermal interaction may occur in those areas of the semiconductor chip which are farthest from a neutral center, or centerline, of the chip. Accordingly, at least some of the bond pads having irregular or composite configurations may be located in one or more of the corner regions of the semiconductor chip, where the differential thermal expansion problems discussed above may be the greatest. Moreover, these stress and/or strain mitigation effects may be of particular importance when the affected metallization layers below the bond pads are made up of low-k and/or ultra-low-k (ULK) dielectric materials, both of which generally have substantially reduced mechanical strength as compared to typical oxide or nitride dielectrics.

Figure 1B:
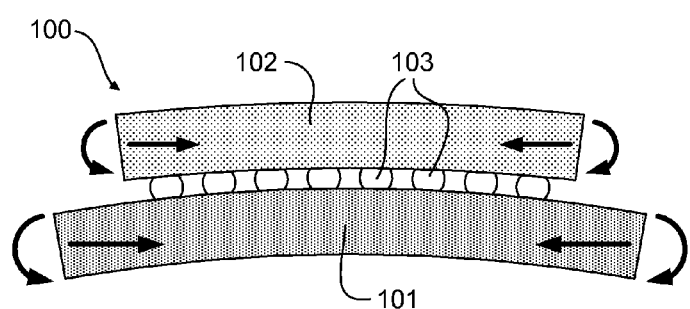
Figure 1C:
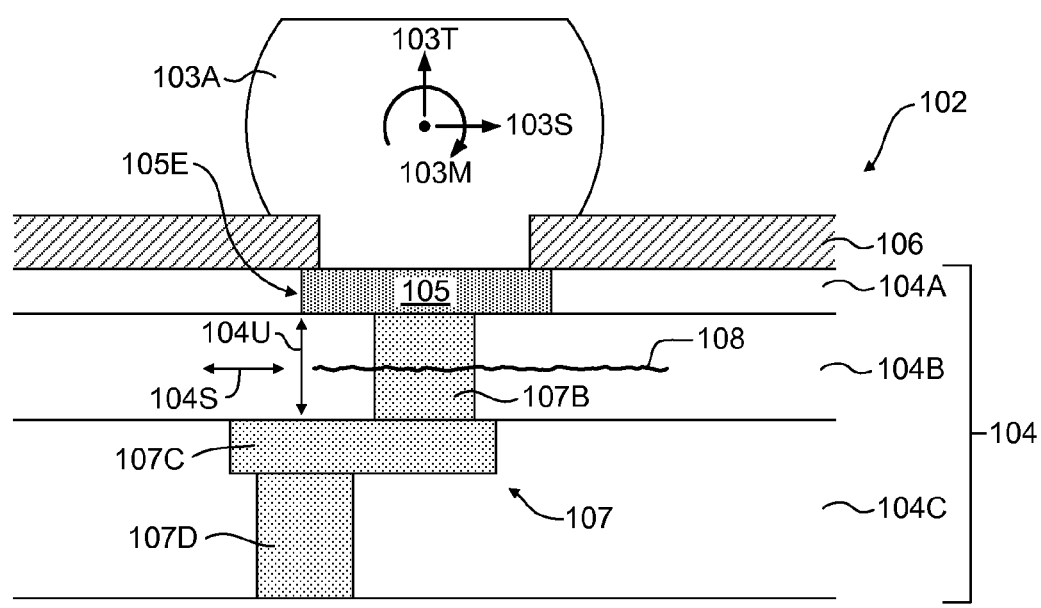
FIG. 1c schematically illustrates out-of-plane loading on a solder ball and metallization system of a semiconductor chip after the flip-chip packaging operation of FIGS. 1a-1b.

It should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor chip 102 depicted in FIG. 1c, it should be understood that the passivation layer 106 is formed "above" the last metallization layer 104A, and the conductive bond pad 105 is positioned "below" or "under" the solder bump 103A. Similarly, it should also be noted that the passivation layer 106 may be positioned "on" the last metallization layer 104A in those embodiments wherein no other layers or structures are interposed therebetween.

Figure 2A:
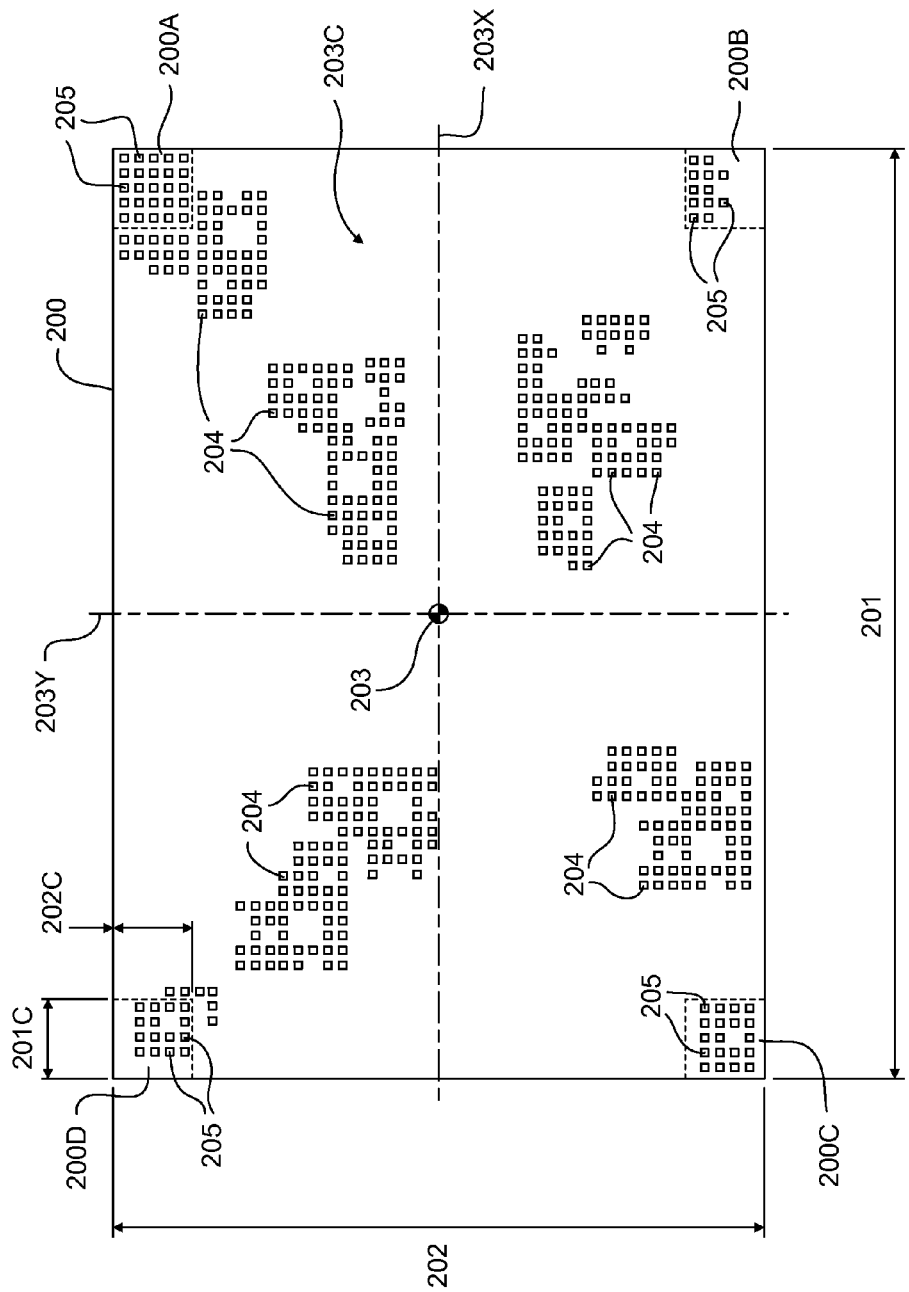
FIG. 2a schematically illustrates a plan view of a semiconductor chip in accordance with one illustrative embodiment of the present disclosure.

FIG. 2a schematically depicts a plan view of an illustrative embodiment of a semiconductor chip 200 in accordance with one illustrative embodiment of the present disclosure. The semiconductor chip 200 may have a substantially rectangular configuration, with a chip length 201 and a chip width 202, as well as a chip center 203 through which runs a first centerline 203X aligned with the chip length 201 and a second centerline 203Y aligned with the chip width 202. Depending on the specific application, the chip length and width dimensions 201, 202 of the semiconductor chip 200 may range from approximately 0.5 cm up to approximately 2.5 cm or even larger, and they may have the same (i.e., a square chip) or different (i.e., a rectangular chip) dimensions. In certain illustrative embodiments, the semiconductor chip 200 may include a plurality bond pads 204 that have a substantially regularly shaped surface area, and a plurality of bond pads 205 that have a substantially irregularly shaped surface area. Additionally, it should be understood that a plurality of solder bumps, such as the solder bumps 103 of FIGS. 1a-1c, may be formed above both pluralities of bond pads 204 and 205, and which for clarity are not shown. Furthermore, it should also be understood that the semiconductor chip 200 may be assembled in a chip package using a flip-chip operation, much as described above with respect to the semiconductor chip 102 of the chip package 100 and illustrated in FIGS. 1a-1b.

As shown in FIG. 2a, the regularly shaped bond pads 204 may generally be located in a substantially central region 203C of the semiconductor chip 200, and in certain illustrative embodiments may have a surface area that has a substantially regular geometric shape, as will be discussed further with respect to FIGS. 2b-2c below. The irregularly shaped bond pads 205, on the other hand, may in some illustrative embodiments have a surface area that has a substantially irregular geometric shape that is adapted to reduce the level of stresses and/or strains induced in the metallization layers underlying the irregularly shaped bond pads 205, as will also be discussed in additional detail with respect to FIGS. 2d-2k below. Furthermore, the irregularly shaped bond pads 205 may be located at some distance away from the central region 203C, such as in each of the corner regions 200A-D of the semiconductor chip 200, where chip package thermal interactions are typically highest, and where white bump occurrence may be higher, as previously discussed. In certain illustrative embodiments, each of the corner regions 200A-D may have a length 201C that is approximately one-tenth, or 10%, of the chip length 201, and a width 202C that is approximately one-tenth, or 10%, of the chip width 202. Moreover, it should be noted that in at least some illustrative embodiments of the present disclosure, both the plurality of regular bond pads 204 and the plurality of irregular bond pads 205 may be arranged on a substantially square or rectangular grid-like pattern so as to facilitate the photolithography patterning process that may be used to pattern the final metallization layer of the semiconductor chip, as well as the passivation layer and the solder bumps formed thereabove. Moreover, depending on the device design and layout requirements, the spacing and/or density of the grid-like pattern may vary from area to area over the semiconductor chip 200, or the grid-like pattern may continue substantially uninterrupted over the entirety of the semiconductor chip 200.

Figure 2B:
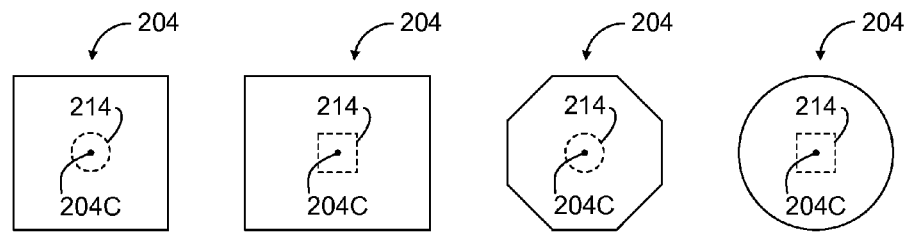
FIGS. 2b-2c schematically illustrate plan views of representative prior art bond pads.

FIG. 2b schematically illustrates several different substantially regular geometric shapes that may be representative of the shape of the surface area 204A of one or more of the plurality of regularly shaped bond pads 204. For purposes of the present disclosure, it should be noted that the term "substantially regular geometric shape" is not intended to be interpreted as a "regular polygon," which would be a shape having a specific mathematical definition wherein the shape is both equilateral (i.e., having equal length sides) and equiangular (i.e., having equally sized included angles). Instead, the term "substantially regular geometric shape" should be understood as being descriptive of a readily recognizable polygon or other geometric shape, such as a square, a rectangle, or an octagon, and the like, which may be formed using typical semiconductor manufacturing techniques. However, it should be noted that a "substantially regular geometric shape" may not be a precise "regular polygon" as described above, or have the exact geometric accuracy as if such structures were drawn on paper with mathematical precision.

As shown in FIG. 2b, the surface area 204A of any one of the regularly shaped bond pads 204 may be any one of several substantially regular geometric shapes, such as, for example: a) a square; b) a rectangle; c) an octagon; d) a circle; etc. Other substantially regular geometric shapes may also be used. Furthermore, in at least some embodiments, the regularly shaped bond pad 204 may be positioned so that a centroid 204C of the surface area 204A may be located above a contact via 214 formed in the metallization layer underlying the bond pad 204. Additionally, as shown in FIG. 2b, the contact via 214 may have a cross section (indicated as a dotted line) that is also one of several substantially regular geometric shapes, such as a square, rectangle, circle and the like. Some specific aspects of a regularly shaped bond pad 204 having, for illustrative purposes only, a substantially square shape, are illustrated in FIG. 2c and will now be discussed in further detail.

Figure 2C:
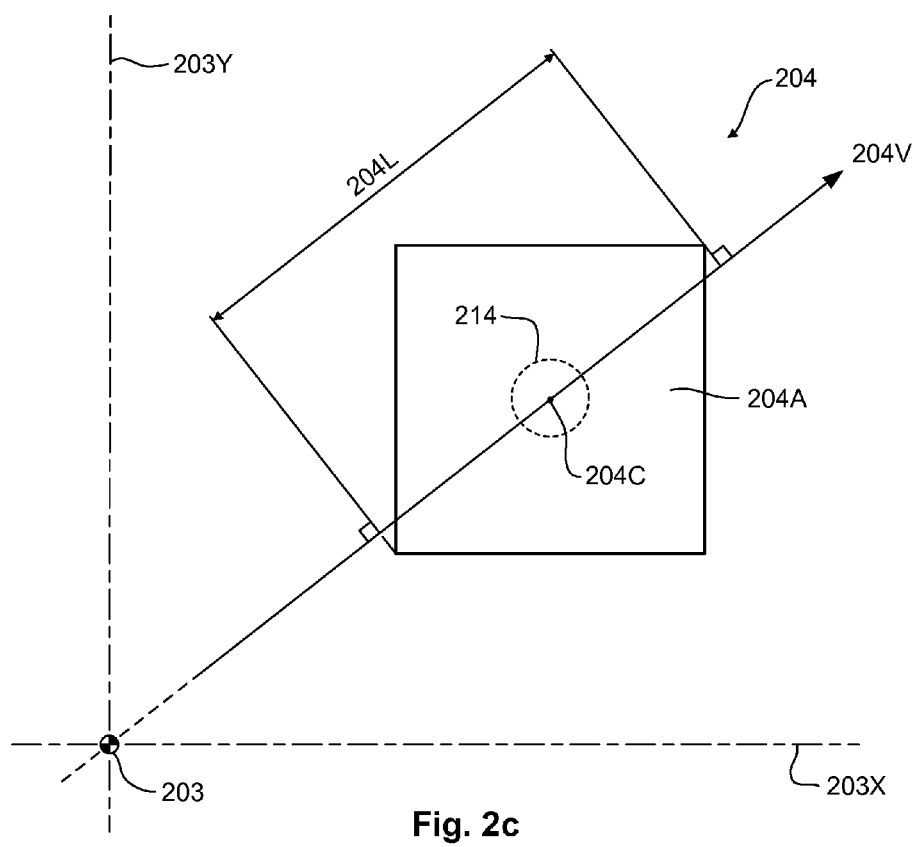

As shown in FIG. 2c, the illustrative regularly shaped bond pad 204 having a substantially square shape has surface area 204A and a surface area centroid 204C. Furthermore, it should be appreciated by one of ordinary skill in the art that any out-of-plane loads imposed on the regularly shaped bond pad 204 by the differential thermal interaction between the semiconductor chip 200 and a carrier substrate during the chip package assembly process, such as the loads 103T (tension), 103S (shear) and 103M (bending moment) shown in FIG. 1c above, may be considered to act substantially along a vector 204V running from the center 203 of the chip 200 and the centroid 204C. Furthermore, the loads imposed on the underlying metallization layers by the regularly shaped bond pad 204 will generally be proportional to the geometric properties of the surface area 204A of the bond pad 204 along the vector 204V. Accordingly, both the tension load (such as the tension load 103T; see FIG. 1c) and the shear load (such as the shear load 103S; see FIG. 1c) imposed on the regularly shaped bond pad 204 during the chip package thermal interaction will generally be distributed to the underlying metallization layers based on the surface area 204A of the regularly shaped bond pad 204. On the other hand, the bending moment (such as the bending moment 103M; see FIG. 1c) will generally be distributed to the underlying metallization layers based on the length 204L of the regularly shaped bond pad 204 along the direction of the vector 204V.

Figure 2D:
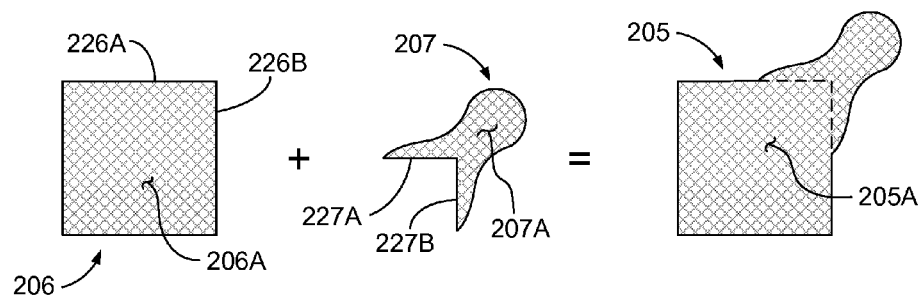
FIGS. 2d-2f schematically illustrate plan views of a bond pad in accordance with one illustrative embodiment of the present disclosure.
Figure 2E:
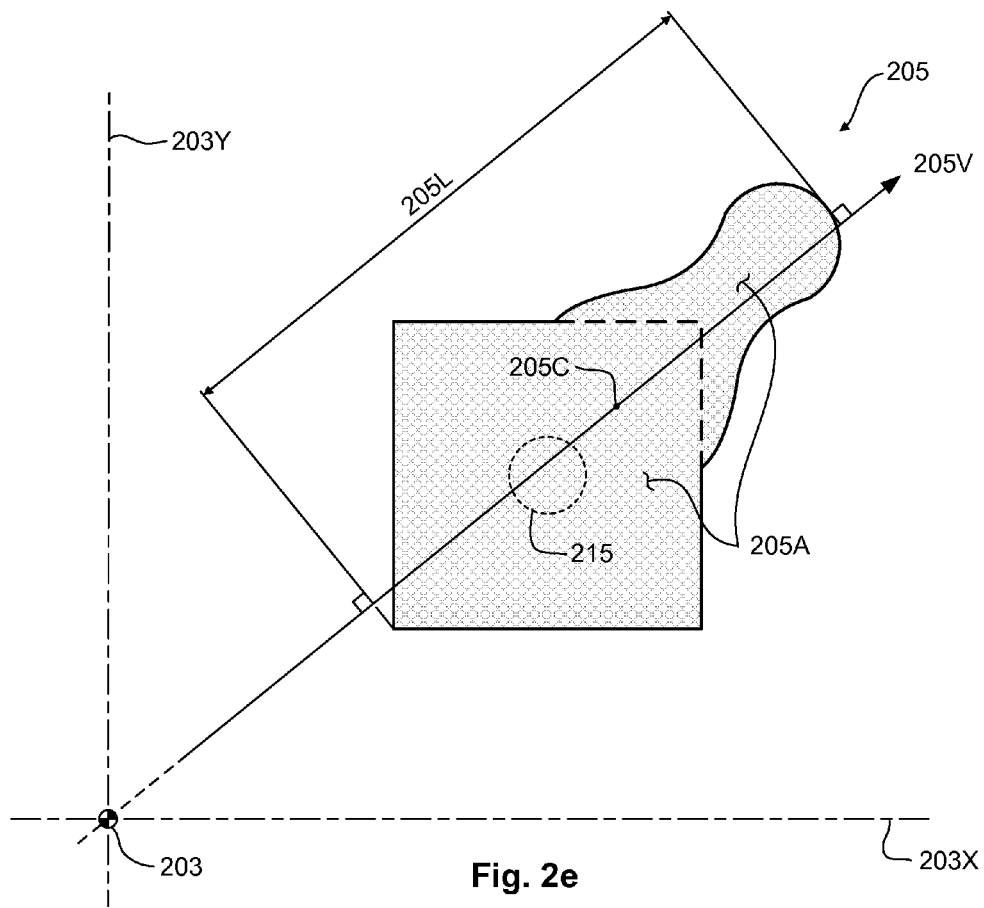

With reference to FIGS. 2d-2e, in contrast to the geometric properties of the surface area 204A of the regularly shaped bond pad 204, the geometric properties of the surface area 205A of the irregularly shaped bond pads 205 may be configured so as to reduce the magnitude of the loads imparted on the underlying metallization layers, thereby also reducing the likelihood of crack-like defects below the bond pads 205—i.e., white bumps. For purposes of the present disclosure, it should be noted that an irregularly shaped bond pad 205 is one that has a surface area 205A, which, when viewed from above and taken in its entirety, does not have a "substantially regular geometric shape" as previously described with respect to the regularly shaped bond pads 204. Instead, the surface area 205A of the irregularly shaped bond pads 205 may be representative of a more complex and irregular or composite geometric shape. Unlike the "substantially regular geometric shapes" of the regularly shaped bond pads 204, it should be understood that an "irregular geometric shape" is one that is not a readily recognizable polygon or other geometric shape, such as a square, a rectangle, or an octagon, and the like.

In certain embodiments, the surface area 205A of the irregularly shaped bond pads 205 may be defined by a plurality of different contiguous surface area portions when viewed from above. For example, as shown in FIG. 2d, one illustrative irregularly shaped bond pad 205 defined by the presently disclosed subject matter may have a surface area 205A that is represented by a first portion 206 having a first portion surface area 206A and a second portion 207 having a second portion surface area 207A. Stated another way, the surface area 205A is a composite surface area of the first portion surface area 206A and the second portion surface area 207A. In some embodiments, the first portion surface area 206A may be defined by a substantially regular geometric shape, such as a geometric shape that is substantially similar to that of the surface area 204A of the regularly shaped bond pads 204. On the other hand, the second portion surface area 207A may be representative of an irregular geometric shape—i.e., a shape that is not a readily recognizable polygon, square, or other geometric shape—as depicted in FIG. 2d. In other illustrative embodiments, both of the surface areas 206A and 207A may represent irregular geometric shapes when viewed from above. In still further embodiments, both of the surface areas 206A and 207A may represent substantially regular geometric shapes, while the overall shape of the combined surfaces 206A, 207A, when viewed from above, is not a readily recognizable geometric shape, such as a rectangle or a square.

As shown in FIG. 2d and noted above, the overall surface area 205A of the irregularly shaped bond pad 205 is a substantially contiguous shape which, for convenience of description, can be separated into a first portion surface area 206A having a substantially regular geometric shape, i.e., a square, and a second portion surface area 207A having an irregular geometric shape. Accordingly, it should be understood that when the surface area 205A is viewed from above it is a composite of the first and second portion surface areas 206A and 207A, wherein the first portion surface area 206A is proximate or adjacent to the second portion surface area 207A. Furthermore, it should also be understood that the sides 227A and 227B of the second portion surface area 207A may be substantially aligned and flush with the sides 226A and 227B, respectively, of the first portion surface area 206A.

Some specific aspects of an irregularly shaped bond pad 205 having the irregular geometric shape as shown in FIG. 2d are illustrated in further detail in FIG. 2e and described below.

As shown in FIG. 2e, the illustrative irregularly shaped bond pad 205 has an overall combined surface area 205A and a surface area centroid 205C. Furthermore, the irregularly shaped bond pad 205 may be formed above a contact via 215 (indicated in FIG. 2e as a dotted line). As noted above with reference to FIG. 2d, the irregularly shaped bond pad 205 of FIG. 2e can be broken down into a first portion surface area 206A and a second portion surface area 207A. In certain embodiments, the first portion surface area 206A may be defined by a substantially regular geometric shape, such as the substantially square shape illustrated in FIG. 2e, while in other embodiments, different substantially regular geometric shapes may also be used, e.g., a substantially rectangular or octagonal shape, and the like.

As noted with respect to the regularly shaped bond pads 204 of FIG. 2c above, the loads imposed on the underlying metallization layers by the irregularly shaped bond pad 205 of FIG. 2e may be similarly proportional to the geometric properties of the overall combined surface area 205A of the irregularly shaped bond pad 205 along a vector 205V running from the center 203 of the semiconductor chip 200 and through the centroid 205C. That is, both the tension load (such as the tension load 103T) and the shear load (such as the shear load 103S) imposed on the irregularly shaped bond pad 205 will generally be distributed to the underlying metallization layers based on the overall combined surface area 205A of the irregularly shaped bond pad 205. Furthermore, the bending moment (such as the bending 103M) will generally be distributed to the underlying metallization layers based on a length 205L of the irregularly shaped bond pad 205 along the direction of the vector 205V. Accordingly, in those illustrative embodiments of the present disclosure where the first portion 206 of the irregular bond pad 205 has a surface area 206A that is substantially the same size and shape as the surface area 204A of the regularly shaped bond pad 204, an irregularly shaped bond pad 205 that also includes a contiguous second portion 207 positioned substantially along the vector 205V will have a length 205L that is greater than the length 204L and an overall combined surface area 205A that is greater than the area 204A. As a result, the loads imparted on any given point of the underlying metallization layers—and the resultant stresses and strains—by the irregularly shaped bond pad 205 may be displaced from sensitive underlying circuitry, and may be lower than those on a similarly situated but regularly shaped bond pad 204, thereby possibly reducing the likelihood of white bump occurrences.

The bond pads 204 and 205 illustrated in FIGS. 2c and 2e, respectively, may be formed in accordance with substantially similar processing steps. For example, a last metallization layer, such as the metallization layer 104A shown in FIG. 1c, may be formed above a metallization layer comprising a low-k or ULK material, such as the metallization layer 104B of FIG. 1c. The last metallization layer may formed of a typical dielectric material having a higher material strength than the low-k or ULK material of the underlying layer, such as silicon dioxide, silicon nitride, and the like. Next, the last metallization layer is patterned to form a bond pad opening above, for example, a contact via formed in the underlying low-k/ULK metallization layer using photolithography techniques well known in the art. Depending on the location of the specific bond pad—i.e., the central region 203C or the corner regions 200A-D—the shape of the patterned bond pad openings formed in the last metallization layer may substantially conform to that of either the regularly shaped bond pad 204 (in the central region 203C) or of the irregularly shaped bond pad 205 (in the corner regions 200A-D). Thereafter, a deposition process is performed, such as an electrochemical deposition process and the like, to form a layer of conductive metal in the bond pad openings and above the last metallization layer. Depending on the device and/or process flow requirements, the conductive metal may be copper, aluminum, or alloys thereof. Finally, a planarization process is performed to remove excess material of the layer of conductive metal from above the last metallization layer.

As noted previously, both the regularly shaped bond pads 204 and the irregularly shaped bond pads 205 may be formed on a substantially square or rectangular grid-like pattern. Additionally, in those embodiments of the presently disclosed subject matter where the shape and size of the regularly shaped bond pads 204 is substantially the same as that of the first portion 206 of the irregularly shaped bond pads 205 (as illustrated in FIGS. 2c and 2e), only minor adjustments may be necessary to the pattern used to form the openings for the irregularly shaped bond pads 205 in the corner areas 200A-D as compared to the openings for the regularly shaped bond pads 204 in the central region 203C. Accordingly, in at least some integration schemes, there may be only a negligible impact on the overall device processing flow requirements.

Figure 2F:
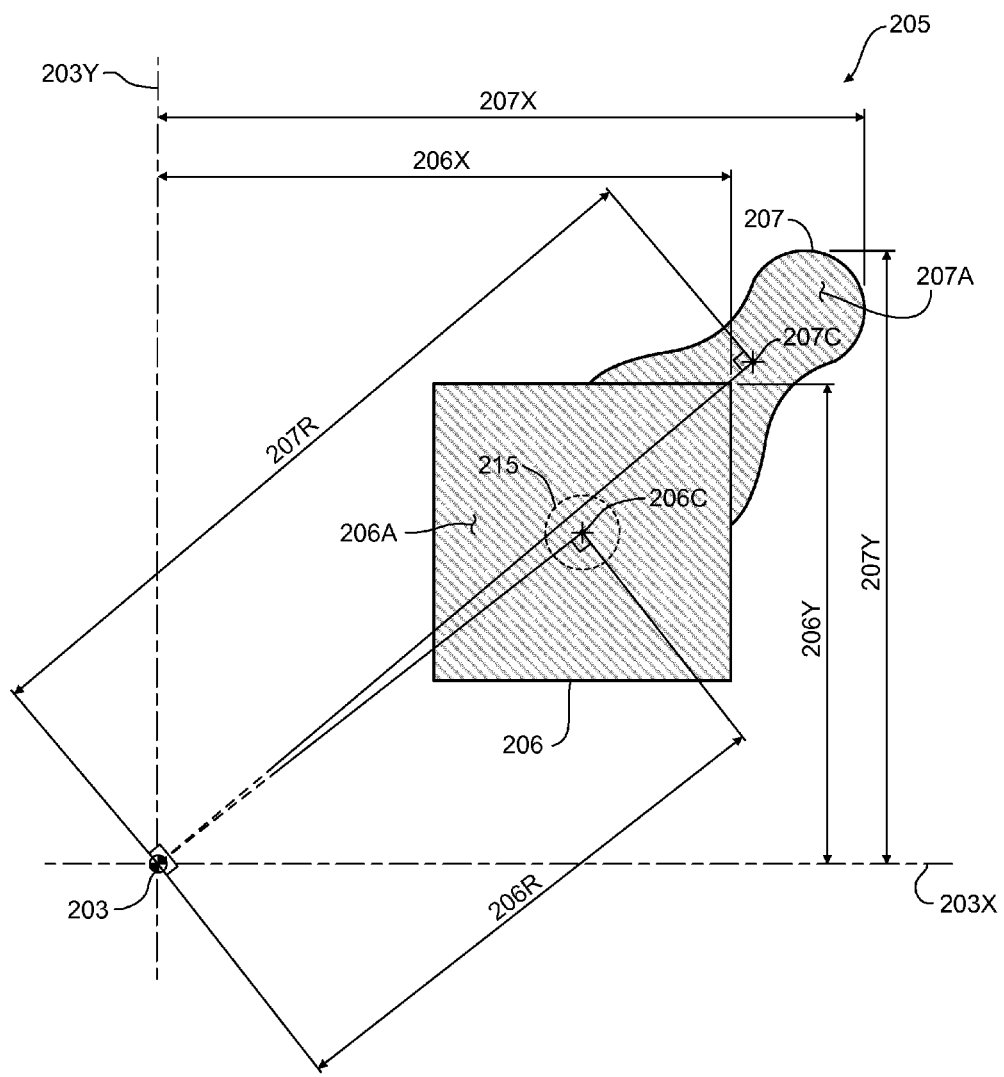

Also as noted previously, the thermal interaction between the semiconductor chip 200 and a carrier substrate cause by the CTE mismatch during the chip packaging process is proportionally greater in those areas of the chip 200 that are at the greatest distance from the center 203 of the chip 200 i.e., the corner regions 200A-D. Accordingly, the greatest benefit in reducing the likelihood of white bump defects may accrue to those embodiments where the second portion 207 of the irregular bond pad 205 is positioned substantially along the vector 205V as shown in FIG. 2e and at a greater distance from the center 203 of the semiconductor chip 200 than the first portion 206. FIG. 2f, which schematically illustrates the geometric relationship of the first and second portions 206, 207 of the irregularly shaped bond pad 205, will now be described.

As shown in FIG. 2f, the first portion 206 has a first portion surface area 206A and a surface area centroid 206C, and the second portion 207 has a second portion surface area 207A and a surface area centroid 207C. The centroid 206C is located at a distance 206R from the center 203 of the semiconductor chip 200, and the centroid 207C is located at distance 207R from the center 203 that is greater than the distance 206R. Furthermore, in at least some embodiments, the irregularly shaped bond pad 205 may be positioned on the semiconductor chip 200 such that the centroid 206C of the first portion surface area 206A may be located above the contact via 215 (indicated by a dotted line).

Additionally, in certain illustrative embodiments, when viewed from above, no portion of the surface area 206A extends beyond a distance 206Y from the centerline 203X of the semiconductor chip 200, whereas at least a portion of the surface area 207A may be located at distance 207Y from the centerline 203X that is greater than the distance 206Y. Similarly, in other embodiments, no portion of the surface area 206A extends beyond a distance 206X from the centerline 203Y, whereas at least a portion of the surface area 207A may be located at distance 207X from the centerline 203Y that is greater than the distance 206X.

Figure 2G:
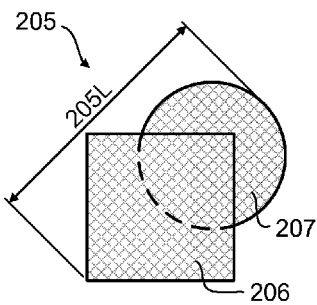
FIGS. 2g-2m schematically illustrate plan view of bond pads in accordance with further illustrative embodiments of the present disclosure.
Figure 2H:
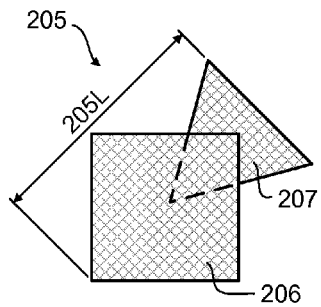
Figure 2I:
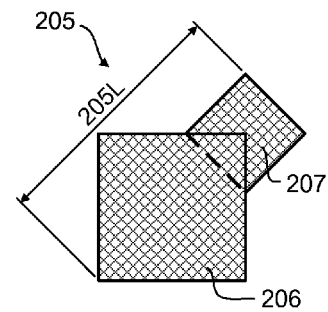
Figure 2J:
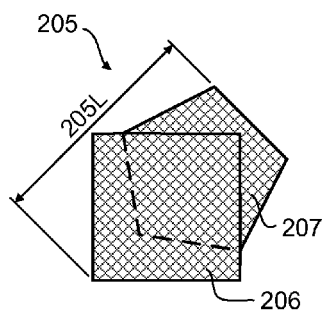
Figure 2K:
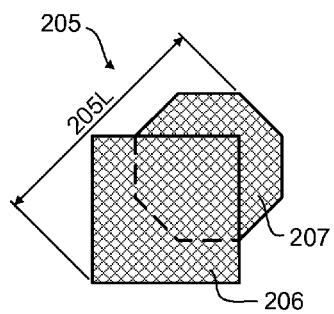

FIGS. 2g-2k schematically depict other illustrative irregularly shaped bond pads 205 of the present disclosure, where the first portion 206 is defined by a substantially regular geometric shape and the second portion 207 is defined by at least a part of a substantially regular geometric shape. For example, FIGS. 2g-2k each illustrate an irregularly shaped bond pad 205 that includes a first portion 206 that is a substantially square shape, whereas the second portion 207 in each of the FIGS. 2g-2k is a part of a different substantially regular geometric shape. In FIG. 2g, for example, the second portion 207 is a part of substantially circular shape, whereas in FIGS. 2h-2k the second portion 207 is a part of a substantially triangular shape, a substantially square shape, a substantially hexagonal shape, and a substantially octagonal shape, respectively. Other substantially regular geometric shapes may be used for the second portion 207, or any irregular geometric shape may also be used. Additionally, it should be noted that as previously described, in other illustrative embodiments, the first portion 206 shown in FIGS. 2g-2k may also be any substantially regular geometric shape other than a square, or it may also be an irregular geometric shape.

Figure 2L:
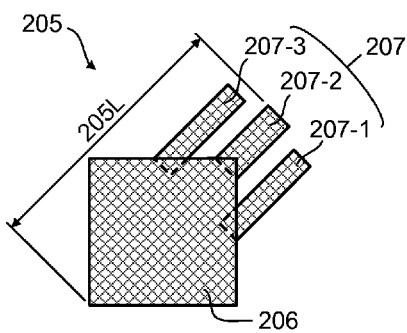

FIG. 2l schematically depicts a further illustrative irregularly shaped bond pad 205 in accordance with the present disclosure, where the first portion 206 is a substantially square shape, but where the second portion 207 may be made up of a plurality of sub-portions, such as the sub-portions 207-1, 207-2 and 207-3. Furthermore, in at least some embodiments, each of the plurality of sub-portions 207-1, 207-2 and 207-3 may also be at least a part of substantially regular geometric shape. For example, in the illustrative embodiment shown in FIG. 2l, each of the sub-portions 207-1, 207-2 and 207-3 may be a part of a substantially rectangular shape, whereas in other embodiments, each of the sub-portions 207-1, 207-2 and 207-3 may be a part of different type of substantially regular geometric shapes.

Figure 2M:
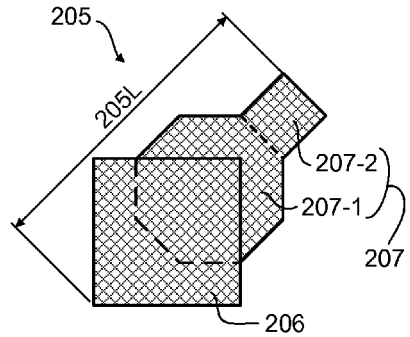

FIG. 2m schematically illustrates yet a further illustrative irregularly shaped bond pad 205, where the first portion is a substantially square shape, but where the second portion 207 may be a composite shape having two or more sub-parts, such sub-parts 207-1 and 207-2. Furthermore, one or more of the subparts 207-1 and 207-2 may also be at least a part of substantially regular geometric shape, as previously described. For example, in the embodiment depicted in FIG. 2m, the first sub-part 207-1 is a part of a substantially octagonal shape, whereas the second sub-part 207-2 of the composite shape 207 is a substantially square shape. Other substantially regular geometric and irregular geometric shapes may also be used.

FIGS. 3a-3f, which schematically depict additional illustrative bond pad structures of the present disclosure, will now be described.

Figure 3A:
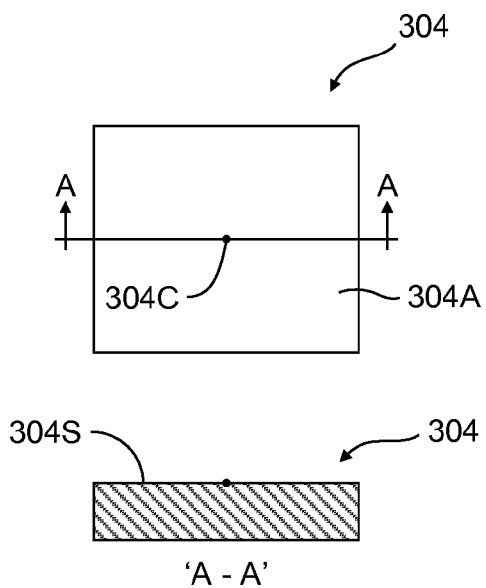
FIG. 3a schematically illustrates plan and section views of a representative prior art bond pad.

FIG. 3a schematically depicts a bond pad 304 of a representative semiconductor chip, where the bond pad 304 has a typical bond pad configuration that is substantially similar to the regularly shaped bond pad 204 shown in FIG. 2c and described above. As with the regularly shaped bond pad 204, the surface area 304A of the bond pad 304 may have a substantially regular geometric shape, wherein in the illustrative embodiment shown in FIG. 3a, the surface area 304A may be a substantially rectangular shape having a length 304L and a width 304W. Depending on the overall device design and the bond pad layout of the semiconductor chip, the length 304L and width 304W may range in size up to 200μ, whereas in specific applications, the length 304L and width 304W may be on the order of 40-50μ. Furthermore, the bond pad 304 has an upper surface 304S as shown in Section A-A of FIG. 3a, and the surface area 304A has a surface area centroid 304C.

Figure 3C:
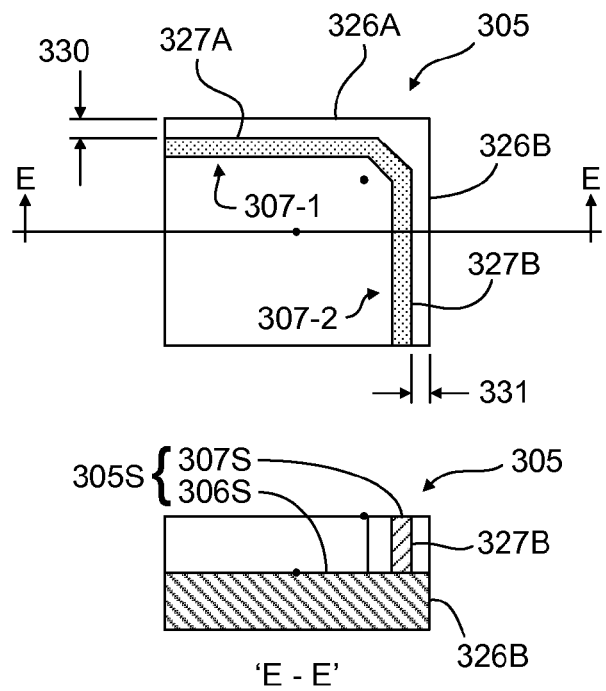
Figure 3B:
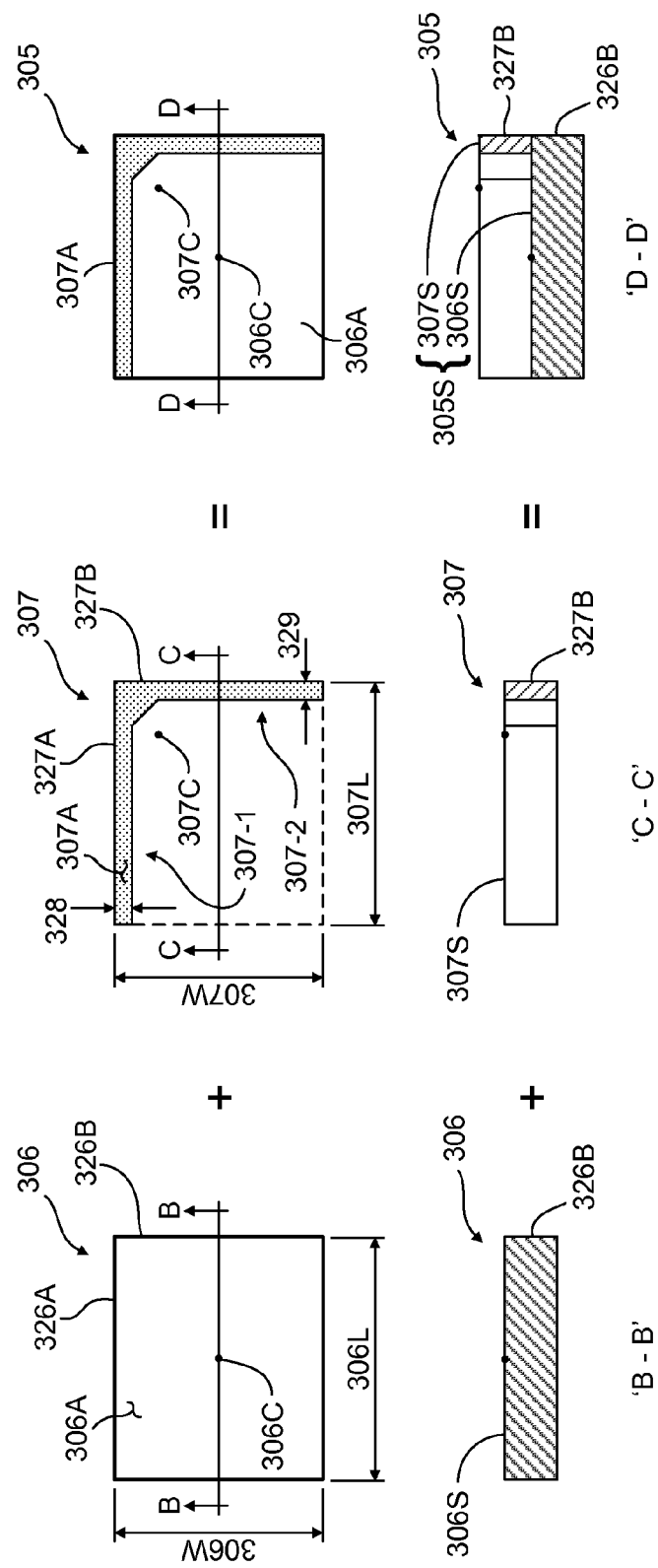

FIG. 3b schematically depicts one illustrative embodiment of a composite bond pad 305 according to the present disclosure that is made up of a base bond pad portion 306 and a strain-buffering bond pad portion 307 above the base bond pad portion 306, such that the composite bond pad 305 has a substantially non-planar upper surface 305S. In certain illustrative embodiments, the strain-buffering bond pad portion 307 may be positioned along two sides 325A, 325B of the composite bond pad 305, and is generally configured to reduce the amount of strain energy that is transmitted through the composite bond pad 305 and into any underlying metallization layers as a result of the CTE mismatch and consequent thermal interaction during the chip packaging process, as previously described.

As shown in FIG. 3b, in some illustrative embodiments the base bond pad portion 306 may be substantially similar in size and shape to the bond pad 304 illustrated in FIG. 3a and described above—that is, where the base bond pad portion 306 has a surface area 306A representing a substantially regular geometric shape (e.g., a substantially rectangular shape), an upper surface 306S, a surface area centroid 306C, a length 306L and a width 306W. The strain-buffering bond pad portion 307 is positioned above the upper surface 306S of the base bond pad portion 306, and has a surface area 307A that may represent an irregular geometric shape, and an upper surface 307S that is located above the upper surface 306S of the base bond pad portion 306. Furthermore, the surface area 307A of the strain-buffering bond pad portion 307 also has a surface area centroid 307C.

In some illustrative embodiments, the strain-buffering bond pad portion 307 may be a part of a substantially regular geometric shape, such as, for example, a substantially rectangular shape (indicated by the dotted lines in FIG. 3b) having a length 307L and a width 307W. Furthermore, the strain-buffering bond pad portion 307 may be made up of a first part 307-1 along the length 327L and a second part 307-2 along the width 307W, as shown in FIG. 3b. Additionally, in at least some embodiments, the first part 307-1 may have a thickness 328 and the second part 307-2 may have a thickness 329. Depending on the overall design of the composite bond pad 305, the thickness 328 may be, in certain embodiments, approximately 5-10% of the length 307L, whereas in other illustrative embodiments the thickness 329 may be approximately 5-10% of the width 307W. For example, thicknesses 328, 329 may range between approximately 2-10μ, depending on the overall size and configuration of the composite bond pad 305. Other thicknesses 328, 329 of the first and second parts 307-1, 307-2, both larger and smaller, may also be used.

In certain illustrative embodiments of the subject matter disclosed herein, the strain-buffering bond pad portion 307 may be positioned above the base bond pad portion 306 such that a side 327A of the first part 307-1 of portion 307 may be proximate to a side 326A of portion 306. Furthermore, in at least some embodiments, the side 327A may be aligned substantially parallel to and substantially flush with the side 326A as shown in FIG. 3b, whereas in other illustrative embodiments, the side 327A may be aligned substantially parallel to the side 326A but offset from the side 326A by a distance 330, as shown in FIG. 3c. Depending on the device design requirements, the offset distance 330 may range from approximately 5-10% of the length 307L, and in certain embodiments may be approximately 2-10μ. Other offset distances 330, both larger and smaller, may also be used.

Similarly, in other illustrative embodiments, a side 327B of the second part 307-2 may also be proximate to a side 326B of the base bond pad portion 306. Furthermore, as with the side 327A, in certain embodiments the side 327B may be aligned substantially parallel to and substantially flush with the side 326B as shown in FIG. 3b, whereas in other illustrative embodiments, the side 327B may be aligned substantially parallel to the side 326B but offset from the side 326B by a distance 331, as shown in FIG. 3c. The offset distance 331 may range from approximately 5-10% of the length 307L, and in certain embodiments may be approximately 2-10μ. Other offset distances 331 may also be used.

In some embodiments, the length 307L may be substantially the same as the length 306L (as illustrated in FIG. 3b), whereas in other embodiments the length 307L may be different than the length 306L. Similarly, in certain embodiments the width 307W may be substantially the same as the width 306W (as illustrated in FIG. 3b), whereas in other embodiments the width 307W may be different than the width 306W. For example, FIG. 3d schematically shows illustrative composite bond pads 305 where the sides 327A and 327B of the strain-buffering bond pad portion 307 are aligned substantially parallel to and substantially flush with the sides 326A and 326B of the base bond pad portion 306, with various relationships between the lengths 307L/306L and the widths 307W/306W. Similarly, FIG. 3e schematically depicts illustrative composite bond pads 305 where the sides 327A and 327B of the strain-buffering bond pad portion 307 are aligned substantially parallel to but offset from the sides 326A and 326B of the base bond pad portion 306, showing various relationships between the lengths 307L/306L and the widths 307W/306W. It should be noted, however, that the above disclosure and the associated Figures should not be construed to limit in any way either of the relative lengths 306L and 307L, or either of the relative widths 306W and 307W, as other relative combinations of lengths and widths may also be used.

Figure 3F:
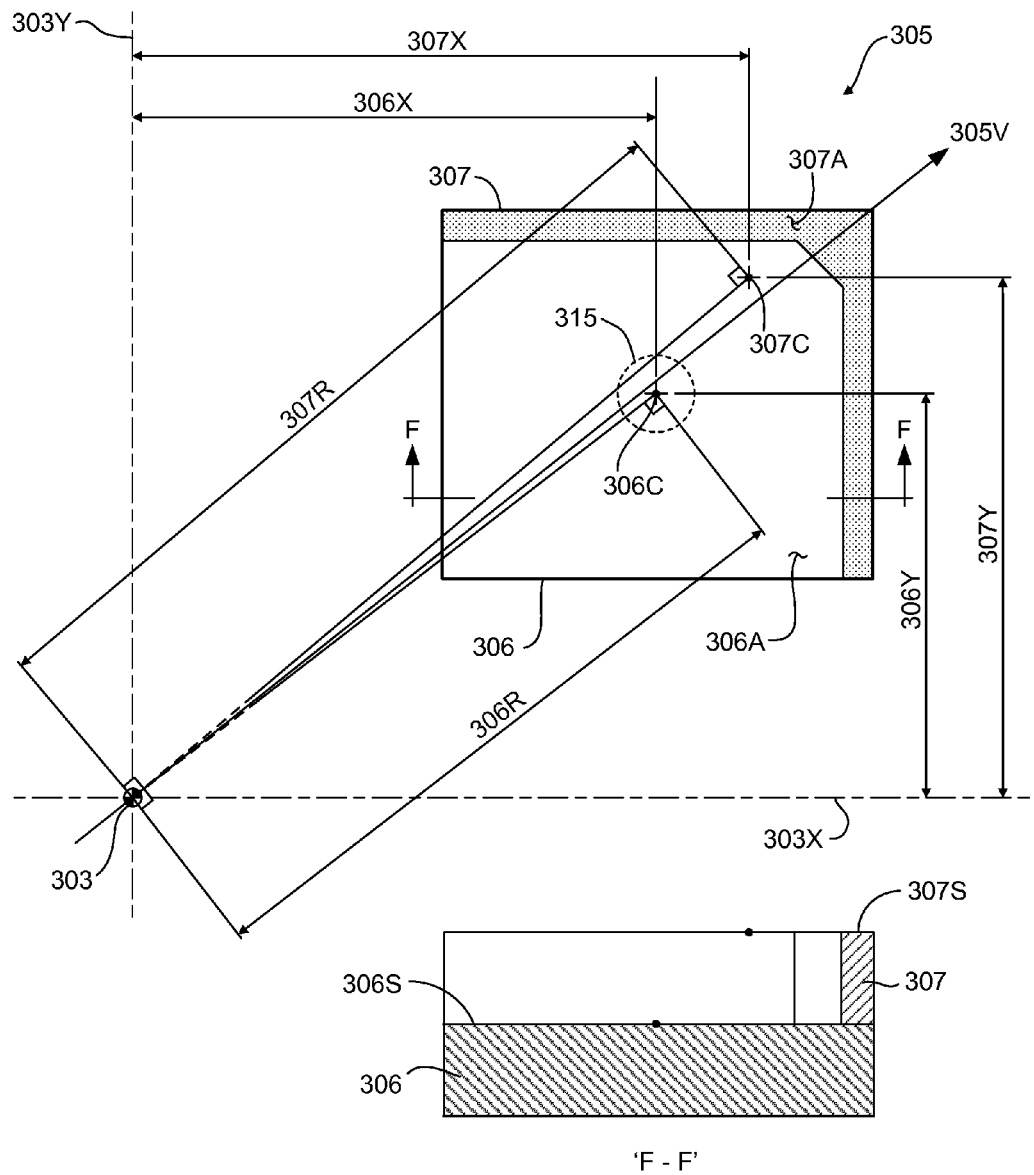

As noted with respect to FIGS. 2a-2m above, the thermal interaction between a semiconductor chip and a carrier substrate cause by the CTE mismatch during the chip packaging process is proportionally greater in those areas of a semiconductor chip that are at the greatest distance from the center of the chip, such as, for example, in the corner regions 200A-D of the semiconductor chip 200 illustrated in FIG. 2a. Accordingly, it should be understood that the greatest benefit in reducing the likelihood of white bump defects may accrue to those embodiments of the present disclosure where the additional material strain-buffering bond pad portion 307 of the composite bond pad 305 is positioned above the base bond pad portion 306 but as far away as possible from the center of a semiconductor chip (not shown) on which the composite bond pad 305 is formed. FIG. 3f, which schematically illustrates the geometric relationship between the base bond pad portion 306 and the strain-buffering bond pad portion 307 of the composite bond pad 305 shown in FIG. 3b, will now be described.

FIG. 3f illustrates the strain-buffering bond pad portion 307 positioned along a vector 305V running between a center 303 of a semiconductor chip (not shown) on which the composite bond pad 305 is formed (such as the semiconductor chip 200 illustrated in FIG. 2a and described above) and the composite bond pad 305. As shown in FIG. 3f, in one illustrative embodiment, the strain-buffering bond pad portion 307 may generally be positioned proximate to the sides of the composite bond pad 305 that are farthest away from the center 303 along the direction of the vector 305V. Additionally, in at least some embodiments disclosed herein, the composite bond pad 305 may be positioned on the semiconductor chip (not shown) above a contact via 315 (indicated in FIG. 3f by a dotted line), whereas in certain embodiments, the centroid 306C of the surface area 306A of the base bond pad portion 306 may be located above the contact via 315. Furthermore, the centroid 306C is located at a distance 306R from the center 303, and the centroid 307C of the surface area 307A of the strain-buffering bond pad portion 307 is located at distance 307R from the center 303 that is greater than the distance 306R.

Additionally, in certain illustrative embodiments, the centroid 306C may be located at a distance 306Y from a centerline 303X of the semiconductor chip (not shown), whereas the centroid 307C may be located at distance 307Y from the centerline 303X that is greater than the distance 306Y. In other embodiments, the centroid 306C may be located at a distance 306X from a centerline 303Y of the semiconductor chip (not shown), whereas the centroid 307C may be located at distance 307X from the centerline 303Y that is greater than the distance 306X.

Figure 3G:
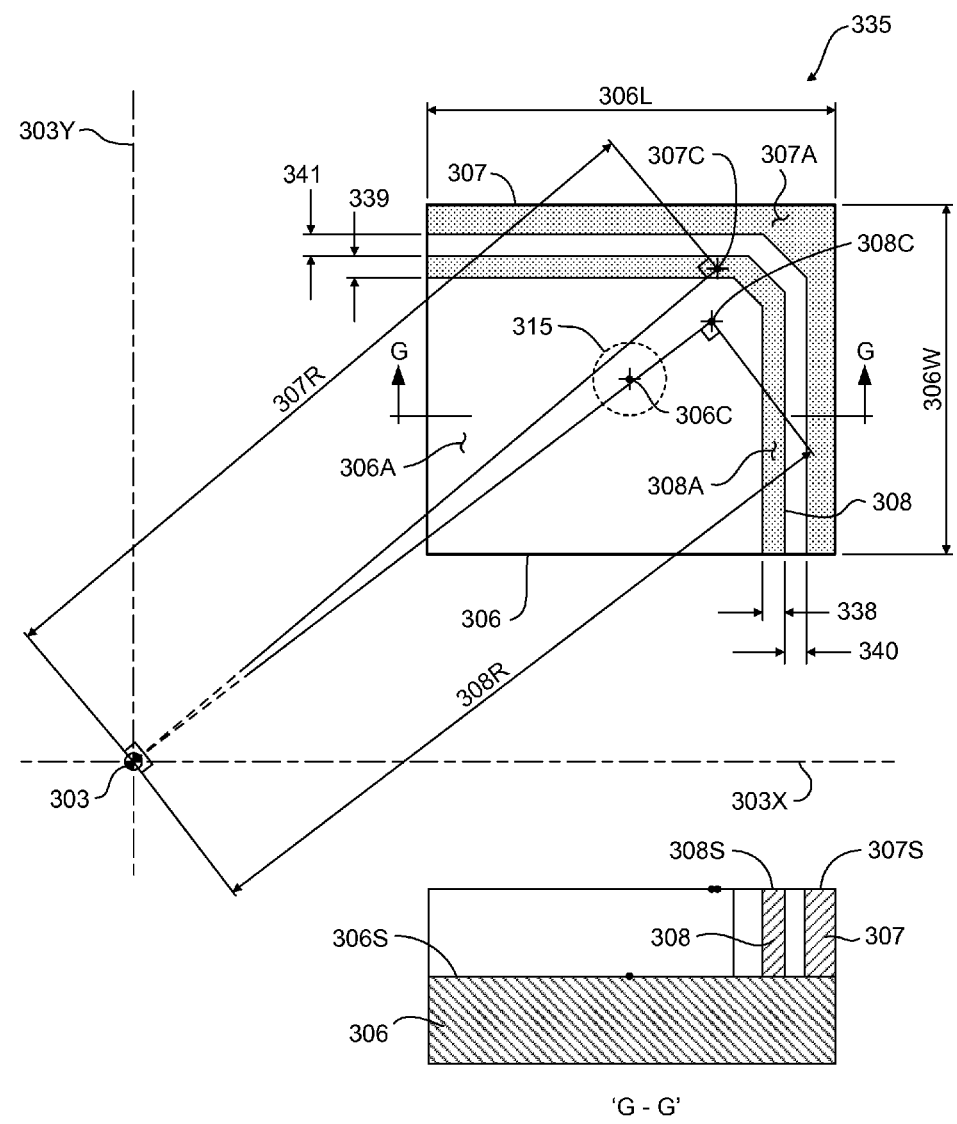
FIGS. 3g-3h schematically illustrate plan and section views of bond pads in accordance with yet further illustrative embodiments of the present disclosure.
Figure 3H:
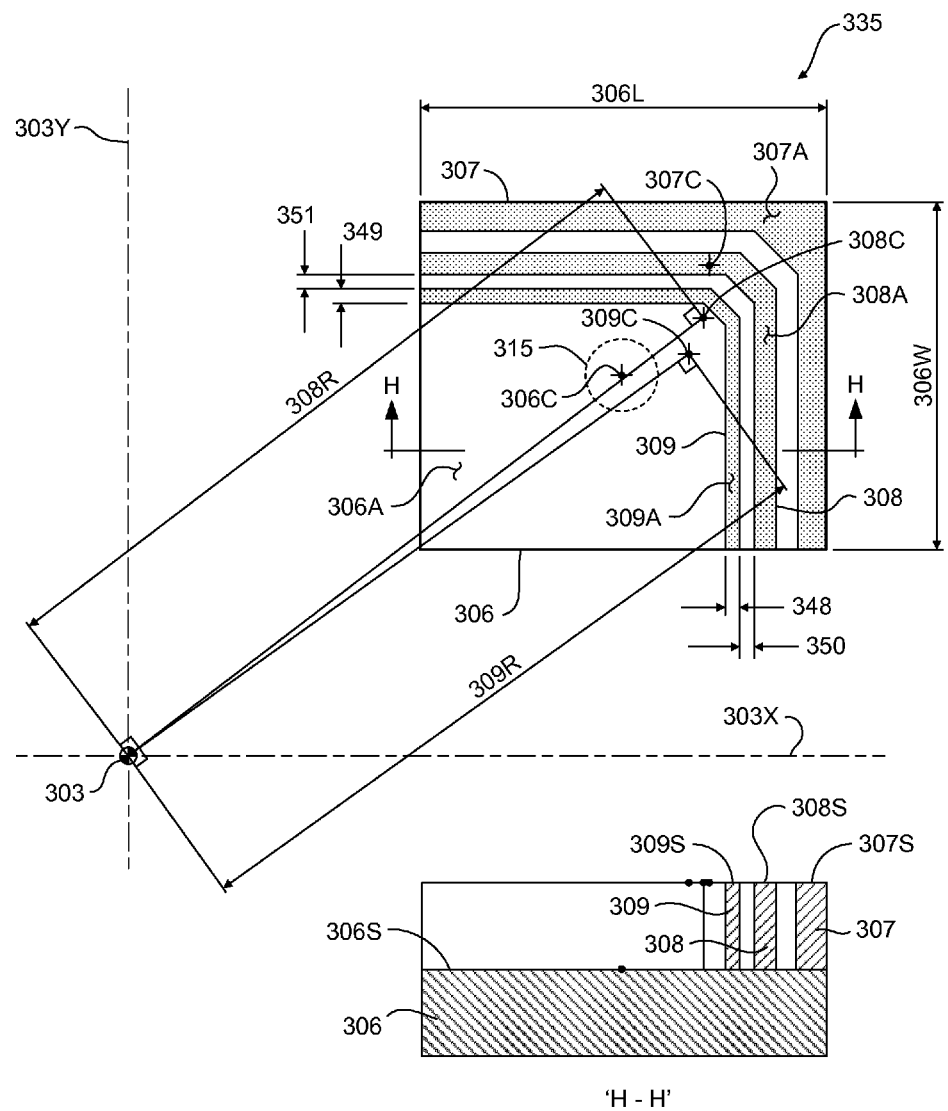

FIGS. 3g-3h schematically illustrate additional illustrative composite bond pads 305 according to the present disclosure.

FIG. 3g schematically shows an illustrative composite bond pad 335 that is substantially similar to the composite bond pad 305 of FIGS. 3b and 3f, wherein however the composite bond pad 335 of FIG. 3g further includes a second strain-buffering bond pad portion 308 positioned above the base bond pad portion 306. The second strain-buffering bond pad portion 308 has a surface area 308A and a surface area centroid 308C, as well as an upper surface 308S that is above the upper surface 306S of the base bond pad portion 306. The centroid 308C is located at a distance 308R from a center 303 of a semiconductor chip (not shown) on which the composite bond pad 335 is formed that is less than the distance 307R from the center 303 to the centroid 307 of the strain-buffering bond pad portion 307. Furthermore, in certain illustrative embodiments, the upper surface 308S may be substantially co-planar with the upper surface 307S of the strain-buffering bond pad portion 307, whereas in other embodiments, the upper surface 308S may be either higher or lower than the upper surface 307S, relative to the upper surface 306S.

In certain embodiments of the present disclosure, the second strain-buffering bond pad portion 308 may have a thickness 338 along a length 306L of the base bond pad portion 306, and may also have a thickness 339 along a width 306W. Additionally, the second strain-buffering bond pad portion 308 may be offset from the strain-buffering bond pad portion 307 such that the portion 308 is not in physical contact with the portion 307, as shown in FIG. 3g. For example, the second strain-buffering bond pad portion 308 may be offset from the strain-buffering bond pad portion 307 by a distance 340 along the length 306L and by a distance 341 along the width 306W. Furthermore, in some illustrative embodiments the thicknesses 338, 339 and the offset distances 340, 341 may range from approximately 5-10% of the respective length 306L or width 306W, as may be appropriate, and in certain embodiments may be approximately 2-10μ. Other thicknesses and offset distances may also be used.

FIG. 3h schematically illustrates yet another illustrative composite bond pad 345 that is substantially similar to the composite bond pad 305 of FIG. 3g above, wherein however the bond pad 345 further includes a third strain-buffering bond pad portion 309 positioned above the base bond pad portion 306. The third strain-buffering bond pad portion 309 has a surface area 309A and a surface area centroid 309C, as well as an upper surface 309S that is above the upper surface 306S of the base bond pad portion 306. The centroid 309C is located at a distance 309R from a center 303 of a semiconductor chip (not shown) on which the composite bond pad 345 is formed that is less than either of the distances 307R and 308R. Furthermore, in certain illustrative embodiments, the upper surface 309S may be substantially co-planar with either or both of the upper surfaces 307S and 308S of the strain-buffering bond pad portion 307 and the second strain-buffering bond pad portion 308, respectively, whereas in other embodiments, the upper surface 309S may be either higher or lower than one or both of the upper surfaces 307S and 308S, relative to the upper surface 306S.

Similar to the second strain-buffering bond pad portion 308 described above, in certain embodiments the third strain-buffering bond pad portion 309 may have a thickness 348 along the length 306L, and may also have a thickness 349 along the width 306W. The third strain-buffering bond pad portion 309 may also be offset from the second strain-buffering bond pad portion 308 such that the portion 309 is not in physical contact with the portion 308, as shown in FIG. 3h. In at least some illustrative embodiments, the third strain-buffering bond pad portion 309 may be offset from the second strain-buffering bond pad portion 308 by a distance 350 along the length 306L and by a distance 351 along the width 306W. Additionally, in certain illustrative embodiments the thicknesses 348, 349 and the offset distances 350, 351 may range from approximately 5-10% of the respective length 307L or width 306L, as may be appropriate, and at least one embodiment may be approximately 2-10μ. Other thicknesses and offset distances may also be used.

The composite bond pads 305, 335, and 345 illustrated in FIGS. 3b-3f, 3g, and 3h respectively, may be formed in accordance with substantially similar processing steps. For example, the base bond pad portions 306 may be formed substantially as described with respect to the bond pads 204 and 205 described above. After planarizing the surface of the base bond pad portions 306, a sacrificial material layer may be formed above the last metallization layer, and a subsequent patterning process may be performed so as to define the openings for strain-buffering bond pad portions 307, 308, 309. Thereafter, a further deposition process, such as an electrochemical deposition process and the like, may be performed so as to deposit a second layer of conductive metal in the openings for the strain-buffering bond pad portions 307, 308, 309 and above the sacrificial layer. The second layer of conductive metal may be any one of several conductive metals that is bondable to the conductive metal of the base bond pad portions 306, such as copper, aluminum, and alloys thereof. A further planarization process may then be performed to remove the excess portions of the second layer of conductive metal from above the sacrificial material layer. Finally the sacrificial material layer is removed by a suitable etch process that is selective relative to the materials of the upper metallization layer, the base bond pad portion 306, and the strain-inducing bond pad portions 307, 308, 309.

As a result, the subject matter disclosed herein provides bond pad configurations that control, or at least mitigate, the effects of semiconductor chip and carrier substrate interactions during the chip packaging process, thereby reducing the likelihood of white bump occurrences.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor chip, comprising:
   at least one integrated circuit device; and
   a bond pad that is electrically connected to said at least one integrated circuit device, said bond pad having an irregular overall configuration when viewed from above that corresponds to a first area portion that is defined by a first substantially regular geometric shape when viewed from above and a second area portion adjacent to said first area portion, wherein at least a part of said second area portion is located at a greater distance from a centerline of said semiconductor chip than any part of said first area portion when viewed from above, and wherein two sides of said first area portion are substantially aligned with and substantially flush with two respective sides of said second area portion.

2. The semiconductor chip of claim 1, wherein said second area portion is defined by at least a part of a second substantially regular geometric shape when viewed from above.

3. The semiconductor chip of claim 2, wherein said irregular overall configuration further corresponds to a third area portion adjacent to said first area portion, said third area portion is defined by at least a part of a third substantially regular geometric shape when viewed from above, and at least a part of said third area portion when viewed from above is located at a greater distance from said centerline than any part of said first area portion when viewed from above.

4. The semiconductor chip of claim 1, wherein said bond pad is located proximate to a corner of said semiconductor chip.

5. The semiconductor chip of claim 4, wherein said semiconductor chip has a length and a width, and said bond pad is located within a first distance from said corner along said length that is approximately 10% of said length and within a second distance from said corner along said width that is approximately 10% of said width.

6. The semiconductor chip of claim 1, wherein said first substantially regular geometric shape is substantially rectangular.

7. The semiconductor chip of claim 2, wherein said second substantially regular geometric shape is substantially octagonal.

8. The semiconductor chip of claim 2, wherein said second geometric shape is substantially rectangular.

9. The semiconductor chip of claim 1, wherein said bond pad is in a last metallization layer of a metallization system that comprises at least one metallization layer comprising a low-k dielectric material having a dielectric constant of approximately 3.0 or lower.

10. The semiconductor chip of claim 1, wherein said bond pad is in electrical contact with a contact via in a metallization layer below said bond pad, and a centroid of said first substantially regular geometric shape is positioned over said contact via.

11. The semiconductor chip of claim 1, further comprising a second bond pad having a configuration that corresponds to a substantially regular geometric shape that is substantially the same as said first substantially regular geometric shape, wherein said second bond pad is closer to said centerline than said bond pad.

12. The semiconductor chip of claim 1, further comprising a solder bump positioned above and electrically contacting said bond pad.

13. The semiconductor chip of claim 1, wherein an upper surface of said first area portion is substantially coplanar with an upper surface of said second area portion.

14. A semiconductor chip, comprising:
    at least one integrated circuit device; and
    a bond pad that is electrically connected to said at least one integrated circuit device, said bond pad having a substantially irregularly shaped overall bond pad configuration when viewed from above that comprises:
       a first bond pad area portion that is defined by a first substantially regular geometric shape when viewed from above; and
       a second bond pad area portion that is defined by at least part of a second substantially regular geometric shape when viewed from above, wherein an upper surface of said second bond pad area portion is substantially coplanar with an upper surface of said first bond pad area portion and two sides of said first bond pad area portion are substantially aligned with and substantially flush with two respective sides of said second bond pad area portion.

15. The semiconductor chip of claim 14, wherein said substantially irregularly shaped overall bond pad configuration further comprises a third bond pad area portion that is defined by at least a part of a third substantially regular geometric shape when viewed from above.

16. The semiconductor chip of claim 15, wherein at least one side of said third bond pad area portion is substantially aligned with and substantially flush with a respective side of said first bond pad area portion.

17. The semiconductor chip of claim 15, wherein at least one side of said third bond pad area portion is substantially aligned with and substantially flush with a respective side of said second bond pad area portion.

18. The semiconductor chip of claim 14, wherein said bond pad is located proximate to a corner of said semiconductor chip.

19. The semiconductor chip of claim 18, wherein said semiconductor chip has a length and a width, and said bond pad is located within a first distance from said corner along said length that is approximately 10% of said length and within a second distance from said corner along said width that is approximately 10% of said width.

20. The semiconductor chip of claim 12, wherein said bond pad is in a last metallization layer of a metallization system comprising at least one metallization layer that comprises a low-k dielectric material having a dielectric constant of approximately 3.0 or lower.

21. A semiconductor chip, comprising:
a first integrated circuit device;
a second integrated circuit device;
a first bond pad that is electrically connected to said first integrated circuit device, said first bond pad having a substantially irregularly shaped overall bond pad configuration when viewed from above that comprises:
   a first bond pad area portion that is defined by a first substantially regular geometric shape when viewed from above, said first bond pad area portion having a first area centroid that is located at a first distance from a center of said semiconductor chip; and
   a second bond pad area portion that is defined by at least part of a second substantially regular geometric shape when viewed from above, said second bond pad area portion having a second area centroid that is located at a second distance from said center of said semiconductor chip that is greater that said first distance; and
a second bond pad that is electrically connected to said second integrated circuit device, said second bond pad having a substantially regularly shaped overall bond pad configuration when viewed from above that is defined by a third substantially regular geometric shape that is substantially the same as said first substantially regular geometric shape, said third substantially regular geometric shape having a third area centroid that is located a third distance from said center of said semiconductor chip that is less than said first distance.

22. The semiconductor chip of claim 21, wherein two sides of said first bond pad area portion are substantially aligned with and substantially flush with two respective sides of said second bond pad area portion, and wherein an upper surface of said first bond pad area portion is substantially coplanar with an upper surface of said second bond pad area portion.

23. The semiconductor chip of claim 21, further comprising a first solder bump positioned above and electrically contacting said first bond pad and a second solder bump positioned above and electrically contacting said second bond pad.

* * * * *